United States Patent
Cical et al.

(10) Patent No.: US 11,003,204 B1
(45) Date of Patent: May 11, 2021

(54) RELAXATION OSCILLATOR HAVING A DYNAMICALLY CONTROLLABLE CURRENT SOURCE

(71) Applicant: Xilinx, Inc., San Jose, CA (US)

(72) Inventors: Ionut C. Cical, Saggart (IE); Edward Cullen, Naas (IE); Brendan Farley, Donabate (IE)

(73) Assignee: XILINX, INC., San Jose, CA (US)

( * ) Notice: Subject to any disclaimer, the term of this patent is extended or adjusted under 35 U.S.C. 154(b) by 204 days.

(21) Appl. No.: 16/216,990

(22) Filed: Dec. 11, 2018

(51) Int. Cl.
| | |
|---|---|
| *G06F 1/08* | (2006.01) |
| *G06F 1/324* | (2019.01) |
| *H03K 3/0231* | (2006.01) |
| *H03K 3/011* | (2006.01) |
| *G06F 1/3296* | (2019.01) |
| *H03B 5/12* | (2006.01) |
| *H03L 7/099* | (2006.01) |

(52) U.S. Cl.
CPC ............... *G06F 1/08* (2013.01); *G06F 1/324* (2013.01); *G06F 1/3296* (2013.01); *H03B 5/1206* (2013.01); *H03B 5/1228* (2013.01); *H03B 5/1253* (2013.01); *H03K 3/011* (2013.01); *H03K 3/0231* (2013.01); *H03L 7/0992* (2013.01)

(58) Field of Classification Search
CPC ...... H03K 3/0231; H03K 3/011; G06F 1/324; G06F 1/3296; G06F 1/08; H03B 5/1228; H03B 5/1253; H03B 5/1206; H03L 7/0992

USPC .................................. 331/111, 143, 185, 176
See application file for complete search history.

(56) References Cited

U.S. PATENT DOCUMENTS

| | | | | |
|---|---|---|---|---|
| 6,362,697 | B1 * | 3/2002 | Pulvirenti | ................ H03K 3/03 331/111 |
| 7,138,880 | B2 * | 11/2006 | Ma | .......................... H03K 3/013 331/143 |
| 9,503,058 | B1 | 11/2016 | Cical et al. | |
| 2010/0141348 | A1 * | 6/2010 | Kang | ................... H03K 3/0231 331/150 |

* cited by examiner

*Primary Examiner* — Arnold M Kinkead
(74) *Attorney, Agent, or Firm* — Patterson + Sheridan, LLP

(57) ABSTRACT

Examples described herein provide for a relaxation oscillator and corresponding methods of operation. In an example, a circuit includes a dynamically controllable current source, a capacitor, and an oscillator generation circuit. The dynamically controllable current source includes a digitally tunable current mirror configured to generate a current. The digitally tunable current mirror includes multiple transistors configured to be selectively electrically connected in parallel to alter a gain of the digitally tunable current mirror to control the current. The capacitor is selectively electrically connected to the dynamically controllable current source. The oscillator generation circuit is electrically connected to the capacitor. The oscillator generation circuit is configured to generate an oscillation signal in response to a voltage of the capacitor.

17 Claims, 6 Drawing Sheets

US 11,003,204 B1

RELAXATION OSCILLATOR HAVING A DYNAMICALLY CONTROLLABLE CURRENT SOURCE

TECHNICAL FIELD

Examples of the present disclosure generally relate to integrated circuits and to methods of operating integrated circuits and, in particular, to an integrated circuit including a relaxation oscillator and to methods of operating the relaxation oscillator.

BACKGROUND

A wide variety of computer and telecommunications devices coordinate operation of and/or communication by various circuits using clock signals. One of the critical challenges for circuit designers is managing timing of their designs. Precise control over timing and clock signals can improve performance and reliability. Controlling timing, however, is becoming increasingly difficult as circuits grow more complex and clock frequencies increase.

SUMMARY

Examples described herein provide for a relaxation oscillator and corresponding methods of operation. Some example relaxation oscillators include a dynamically controllable current source that can be controlled to offset changes in operation of the relaxation oscillator as a result of changes in operating conditions, such as operating supply voltage and operating temperature of the relaxation oscillator. Accordingly, a frequency of an oscillation signal output by the relaxation oscillator can be maintained at a more stable frequency, e.g., without significant variation based on changes of the operating temperature and operating supply voltage.

An example of the present disclosure is a circuit. The circuit includes a dynamically controllable current source, a capacitor, and an oscillator generation circuit. The dynamically controllable current source includes a digitally tunable current mirror configured to generate a current. The digitally tunable current mirror includes multiple transistors configured to be selectively electrically connected in parallel to alter a gain of the digitally tunable current mirror to control the current. The capacitor is selectively electrically connected to the dynamically controllable current source. The oscillator generation circuit is electrically connected to the capacitor. The oscillator generation circuit is configured to generate an oscillation signal in response to a voltage of the capacitor.

Another example of the present disclosure is a method for operating an integrated circuit. An oscillation signal is output from a relaxation oscillator. Outputting the oscillation signal includes alternatingly increasing and decreasing a voltage drop across a capacitor by selectively electrically connecting the capacitor to a dynamically controllable current source. The dynamically controllable current source includes a digitally tunable current mirror configured to generate a current. The digitally tunable current mirror includes multiple transistors configured to be selectively electrically connected in parallel to alter a gain of the digitally tunable current mirror to control the current. One or more operating conditions of the relaxation oscillator are determined. The current generated by the digitally tunable current mirror is controlled based on the one or more operating conditions. Controlling the current generated by the digitally tunable current mirror includes selectively connecting in parallel at least some of the multiple transistors.

A further example of the present disclosure is a circuit. The circuit includes a relaxation oscillator, a system monitor, and calibration logic. The relaxation oscillator includes a dynamically controllable current source, a capacitor, and an oscillator generation circuit. The capacitor is connected to the dynamically controllable current source via one or more switches. The oscillator generation circuit is electrically connected to the capacitor. The oscillator generation circuit is configured to generate an oscillation signal in response to a voltage across the capacitor and to generate a signal to control the one or more switches. The system monitor is configured to sense one or more operating conditions of the relaxation oscillator. The calibration logic is configured to control a current of the dynamically controllable current source based on the one or more operating conditions.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
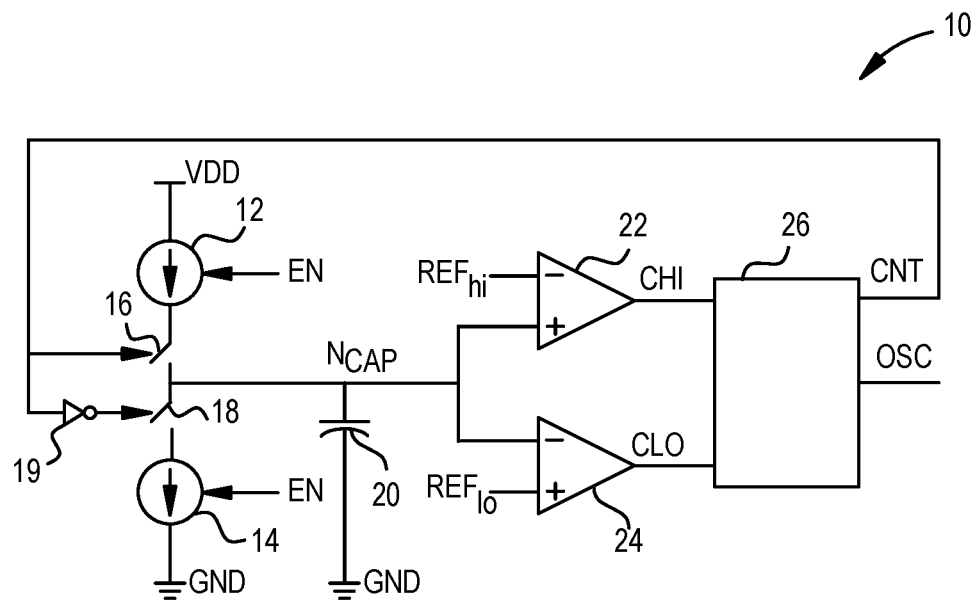
FIG. 1 is a simplified circuit diagram of a relaxation oscillator according to some examples.

Examples described herein provide for a relaxation oscillator and corresponding methods of operation. Example relaxation oscillators include a dynamically controllable current source that can be controlled to offset changes in operation of the relaxation oscillator (which can result in changes to a frequency of a signal output by the relaxation oscillator) as a result of changes in operating conditions, such as operating supply voltage and operating temperature of the relaxation oscillator. The dynamically controllable current source can include a current mirror that includes multiple transistors that can be selectively electrically connected in parallel, e.g., to change a gain of the current mirror to control a current. The multiple transistors can be selectively electrically connected in parallel based on signals determined and transmitted from calibration logic that determines the signals based on process information, operating supply voltage, and operating temperature, for example. The operating supply voltage and operating temperature can be sensed by a system monitor.

During the operation of an integrated circuit (IC), various operating conditions can change over time, such as operating temperature and operating supply voltage. The temperature of the IC can affect mobility of carriers in transistors, can affect threshold voltages of transistors, and can affect resistances in interconnects. For example, an increase in temperature can result in a decrease in mobility and an increase in resistance. The decrease of mobility and increase in resistance can slow operation of the circuit. A change in supply voltage can affect voltages across some transistors, such as gate-to-source voltage $v_{gs}$ and drain-to-source voltage $v_{ds}$, which can affect the operation of the transistors. These changes in temperature and supply voltage can therefore affect the frequency of an oscillation signal output by a relaxation oscillator.

As described in further detail herein, examples can detect the operating temperature and operating supply voltage of a relaxation oscillator, e.g., using a system monitor, and can control a current source of the relaxation oscillator based on the operating temperature, operating supply voltage, and process information of the relaxation oscillator. This control permits the current source to be controlled such that the frequency of the oscillation signal output by the relaxation oscillator can be maintained at a more stable frequency, e.g., without significant variation based on changes of the operating temperature and operating supply voltage.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Even further, various logic states are described as examples below. A person having ordinary skill in the art will readily understand that differing logic states (e.g., complementary from what is described) can be implemented in other examples.

FIG. 1 is a simplified circuit diagram of a relaxation oscillator 10 according to some examples. As will be described, the relaxation oscillator 10 includes a dynamically controllable current source that can be controlled to accommodate for variations resulting from process (P), voltage (V), and temperature (T) (collectively, "PVT").

The relaxation oscillator 10 includes a first current source 12 and a second current source 14. The first current source 12 and the second current source 14 are part of a dynamically controllable current source, which is described in further detail in the context of subsequent figures. The dynamically controllable current source is schematically illustrated by an enable node EN electrically connected to the first current source 12 and the second current source 14. The first current source 12 is electrically connected between a power supply node VDD and a first switch 16. The second current source 14 is electrically connected between a second switch 18 and a ground node GND. The first switch 16 and the second switch 18 may each be, for example, one or more transistors, a transmission gate, or the like. The first switch 16 and second switch 18 are electrically connected (e.g., on sides opposing the first current source 12 and second current source 14, respectively) to a capacitor node $N_{CAP}$. A capacitor 20 is electrically connected between the capacitor node $N_{CAP}$ and the ground node GND. The capacitor node $N_{CAP}$ is further electrically connected to a positive input node of a first comparator 22 and to a negative input node of a second comparator 24. A reference high node $REF_{hi}$ is electrically connected to a negative input node of the first comparator 22, and a reference low node $REF_{lo}$ is electrically connected to a positive input node of the second comparator 24.

The respective output nodes of the first comparator 22 and the second comparator 24 are electrically connected to input nodes of logic 26. The output node of the first comparator 22 is designated as a comparison high node CHI, and the output node of the second comparator 24 is designated as a comparison low node CLO. For convenience herein, logic signals on the comparison high node CHI and comparison low node CLO are designated as (CHI, CLO). For example, "(0,1)" indicates that the signal on the comparison high node CHI is a low logic state, and that the signal on the comparison low node CLO is a high logic state. As illustrated, the signal on the comparison high node CHI is a high logic state when the voltage of the capacitor node $N_{CAP}$ exceeds a reference high voltage $V_{hi}$ on the reference high node $REF_{hi}$; otherwise, the signal on the comparison high node CHI is a low logic state. Further, as illustrated, the signal on the comparison low node CLO is a high logic state when the voltage of the capacitor node $N_{CAP}$ is less than a reference low voltage $V_{lo}$ on the reference low node $REF_{lo}$; otherwise, the signal on the comparison low node CLO is a low logic state.

The logic 26 has an oscillator output node OSC on which an oscillation signal is output. The logic 26 has a control node CNT electrically connected to a control input node of the first switch 16 and to an input node of an inverter 19, which has an output node electrically connected to a control input node of the second switch 18. The logic 26 can include, for example, latches (e.g., an S—R latch) and/or combinational logic to implement logic as described below. The illustrated inverter 19, first switch 16, and second switch 18 are illustrated to generalize the complementary control of the first switch 16 and second switch 18. As shown in a subsequent figure, an inverter may be omitted by some configurations.

Figure 2:
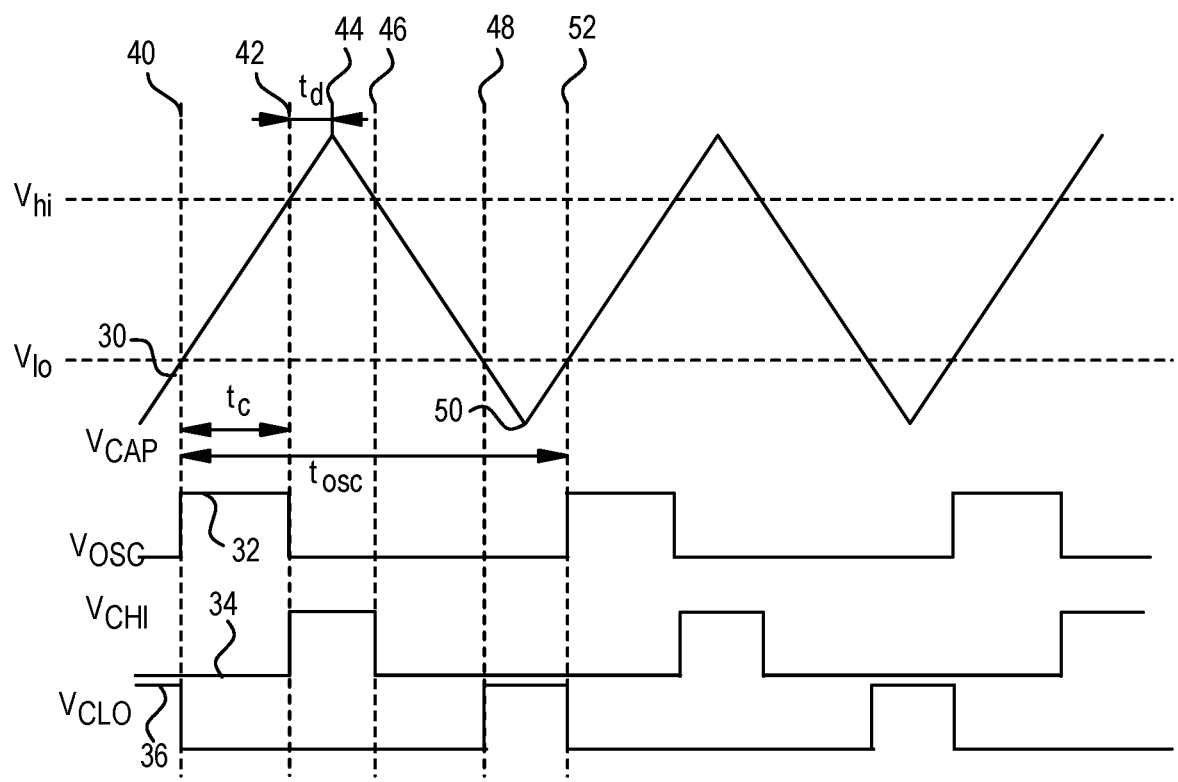
FIG. 2 illustrates example waveforms of voltages at various nodes of the relaxation oscillator of FIG. 1 according to some examples.

FIG. 2 illustrates example waveforms of voltages at various nodes of the relaxation oscillator 10 of FIG. 1 according to some examples. FIG. 2 illustrates a waveform of a voltage $V_{CAP}$ 30 across the capacitor 20, a voltage $V_{OSC}$ 32 of an oscillation signal on the oscillator output node OSC of the logic 26, a voltage $V_{CHI}$ 34 of a comparison high signal on the comparison high node CHI, and a voltage $V_{CLO}$ 36 of a comparison low signal on the comparison low node CLO.

Figure 3:
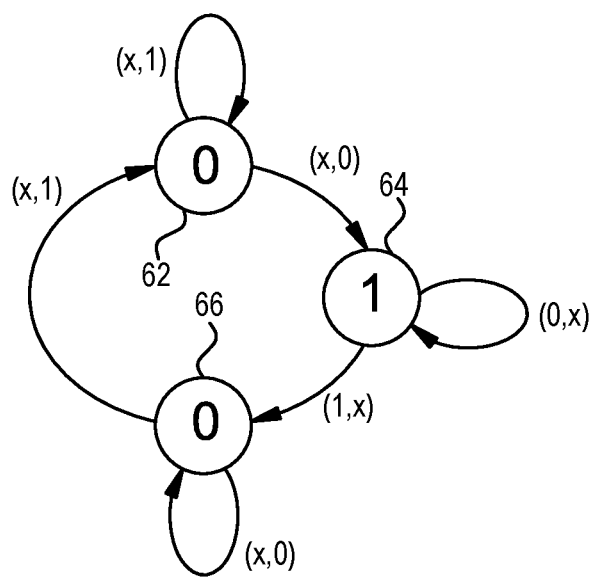
FIG. 3 is a state sequence of an oscillation signal on an oscillator output node of the relaxation oscillator of FIG. 1 according to some examples.
Figure 4:
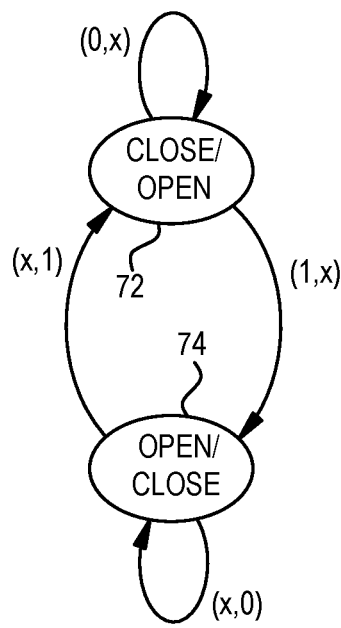
FIG. 4 is a state sequence of switches of the relaxation oscillator of FIG. 1 according to some examples.

FIGS. 3 and 4 are state sequences of the relaxation oscillator 10 of FIG. 1 according to some examples. FIG. 3 shows the state sequence of the oscillation signal on the oscillator output node OSC of the logic 26 as a function of the logic signals on the comparison high node CHI and comparison low node CLO, as designated by (CHI, CLO). FIG. 4 shows the state sequence of the first switch 16 and the second switch 18 as a function of the logic signals on the comparison high node CHI and comparison low node CLO, as designated by (CHI, CLO). The waveforms of FIG. 2 and the state sequences of FIGS. 3 and 4 will be described together to illustrate functionality of the logic 26 to enable an implementation of latches and/or combinational logic for the logic 26.

Initially, assume that the voltage $V_{CAP}$ 30 is a low voltage (e.g., 0 V), which causes the signals on CHI and CLO to be (0,1). Further, assume that the state of the oscillation signal is a low logic state at state 62 in FIG. 3. Also, assume that the first switch 16 is closed, and the second switch 18 is opened in state 72 of FIG. 4.

With the first switch 16 closed and the second switch 18 opened in state 72, current flows from the power supply node VDD through the capacitor 20 causing the capacitor 20 to accumulate charge and increase the voltage $V_{CAP}$ 30. Referring to FIG. 2, the voltage $V_{CAP}$ 30 increases from a voltage less than the reference low voltage $V_{lo}$ input into the positive input node of the second comparator 24 to a voltage greater than the reference low voltage $V_{lo}$ at time 40. This causes voltage $V_{CLO}$ to transition to a low logic state, and hence, CHI and CLO transition from (0,1) to (0,0), which in turn causes the oscillation signal to transition from a low logic state in state 62 to a high logic state in state 64 in FIG. 3. The transition of the oscillation signal from a low to high logic state at time 40 is shown in FIG. 2.

The voltage $V_{CAP}$ 30 continues to increase as a result of current flowing to the capacitor 20. The voltage $V_{CAP}$ 30 increases from a voltage less than the reference high voltage $V_{hi}$ input into the negative input node of the first comparator 22 to a voltage greater than the reference high voltage $V_{hi}$ at time 42. This causes voltage $V_{CHI}$ to transition to a high logic state, and hence, CHI and CLO transition from (0,0) to (1,0), which in turn causes the oscillation signal to transition from the high logic state in state 64 to a low logic state in state 66 in FIG. 3. The transition of the oscillation signal from the high logic state to a low logic state at time 42 is shown in FIG. 2. The CHI and CLO transition from (0,0) to (1,0) further causes the control signals that control the first switch 16 and the second switch 18 to toggle from state 72 to state 74 in FIG. 4.

At time 44, the first switch 16 opens, and the second switch 18 closes. As will be described further, a delay $t_d$ occurs from the time 42 where the voltage $V_{CAP}$ 30 exceeds the reference high voltage $V_{hi}$, which causes the control signals of the switches 16 and 18 to be toggled, to the time 44 when the first switch 16 opens and the second switch 18 closes. With the second switch 18 closed, the charge on the capacitor 20 drains to the ground node GND, and the voltage $V_{CAP}$ 30 decreases.

The voltage $V_{CAP}$ 30 decreases from a voltage greater than the reference high voltage $V_{hi}$ to a voltage less than the reference high voltage $V_{hi}$ at time 46. This causes voltage $V_{CHI}$ to transition to a low logic state, and hence, CHI and CLO transition from (1,0) to (0,0), which in turn causes the oscillation signal to remain in the low logic state in state 66 in FIG. 3.

The voltage $V_{CAP}$ 30 continues to decrease as a result of charge from the capacitor 20 draining to the ground node GND. The voltage $V_{CAP}$ 30 decreases from a voltage greater than the reference low voltage $V_{lo}$ to a voltage less than the reference low voltage $V_{lo}$ at time 48. This causes voltage $V_{CLO}$ to transition to a high logic state, and hence, CHI and CLO transition from (0,0) to (0,1), which in turn causes the oscillation signal to transition to state 62 while remaining in the low logic state in FIG. 3. The CHI and CLO transition from (0,0) to (0,1) further causes the control signals that control the first switch 16 and the second switch 18 to toggle from state 74 to state 72 in FIG. 4.

At time 50, the first switch 16 closes, and the second switch 18 opens. As will be described further, a delay $t_d$ occurs from the time 48 where the voltage $V_{CAP}$ 30 is less than the reference low voltage $V_{lo}$, which cause the control signals of the switches 16 and 18 to be toggled, to the time 50 when the first switch 16 closes and the second switch 18 opens. With the first switch 16 closed and the second switch 18 open in state 72, current flows through the capacitor 20 causing the capacitor 20 to accumulate charge and increase the voltage $V_{CAP}$ 30. The voltage $V_{CAP}$ 30 increases from a voltage less than the reference low voltage $V_{lo}$ to a voltage greater than the reference low voltage $V_{lo}$ at time 52, which begins another cycle as described above starting at time 40. Thus, a cycle of the oscillation signal can be generated. This cycle can be repeatedly generated by the relaxation oscillator 10.

Ideally, the time 42 when the voltage $V_{CAP}$ 30 exceeds the reference high voltage $V_{hi}$ and the time 44 when the switches 16 and 18 are toggled are simultaneous (e.g., the delay $t_d$ is 0). However, in practice, a latency occurs in the operation of the comparators 22 and 24, the logic 26, and the switches 16 and 18. This latency causes the delay $t_d$ to be between time 42 and time 44 (which results in the delay $t_d$ being between time 44 and time 46 for the voltage $V_{CAP}$ 30 to decrease), and between time 48 and time 50 (which results in the delay $t_d$ being between time 50 and time 52 for the voltage $V_{CAP}$ 30 to increase). Hence, the latency causes four instances of the delay $t_d$ to be in the cycle period $t_{osc}$ of the oscillation signal. This can impact a frequency and a duty cycle of the oscillation signal.

As described and illustrated, the cycle period $t_{osc}$ is two times a capacitor change time $t_c$ plus four times the delay $t_d$, as shown in Equation (1) below.

$$t_{osc} = 2t_c + 4t_d \qquad \text{Eq. (1)}.$$

The capacitor change time $t_c$ is the capacitance C of the capacitor 20 times the change in voltage across the capacitor 20 ($V_{hi}$ minus $V_{lo}$) over the current I through the capacitor 20, as shown in Equation (2) below.

$$t_c = C*(V_{hi} - V_{lo})/I \qquad \text{Eq. (2)}.$$

Incorporating Equation (2) into Equation (1) and inverting Equation (1) defines the frequency F of the relaxation oscillator 10, as shown in Equation (3) below.

$$F = \frac{1}{t_{osc}} = \frac{1}{2C\frac{V_{hi} - V_{lo}}{I} + 4t_d}. \qquad \text{Eq. (3)}$$

Further, the latency, and hence, delay $t_d$, of the various circuit components of the relaxation oscillator 10 can vary as a function of PVT. For example, as an operating temperature of the relaxation oscillator 10 increases, the latency can change, which causes the frequency of the oscillation signal to vary. Accordingly, the current sources 12 and 14 are dynamically controllable, as described below, to accommodate different PVT to maintain a frequency of the oscillation signal. As shown by Equation (3) above, if the delay $t_d$ varies, the current I can be correspondingly varied to offset the effect of the variation of the delay $t_d$ and substantially maintain a constant frequency. In other examples, reference voltage sources that generate the reference high voltage $V_{hi}$ and/or reference low voltage $V_{lo}$ can be controllable to accommodate different PVT to maintain a frequency of the oscillation signal. Concepts described herein are equally applicable to vary the reference high voltage $V_{hi}$ and/or reference low voltage $V_{lo}$ to substantially maintain a constant frequency.

Figure 5:
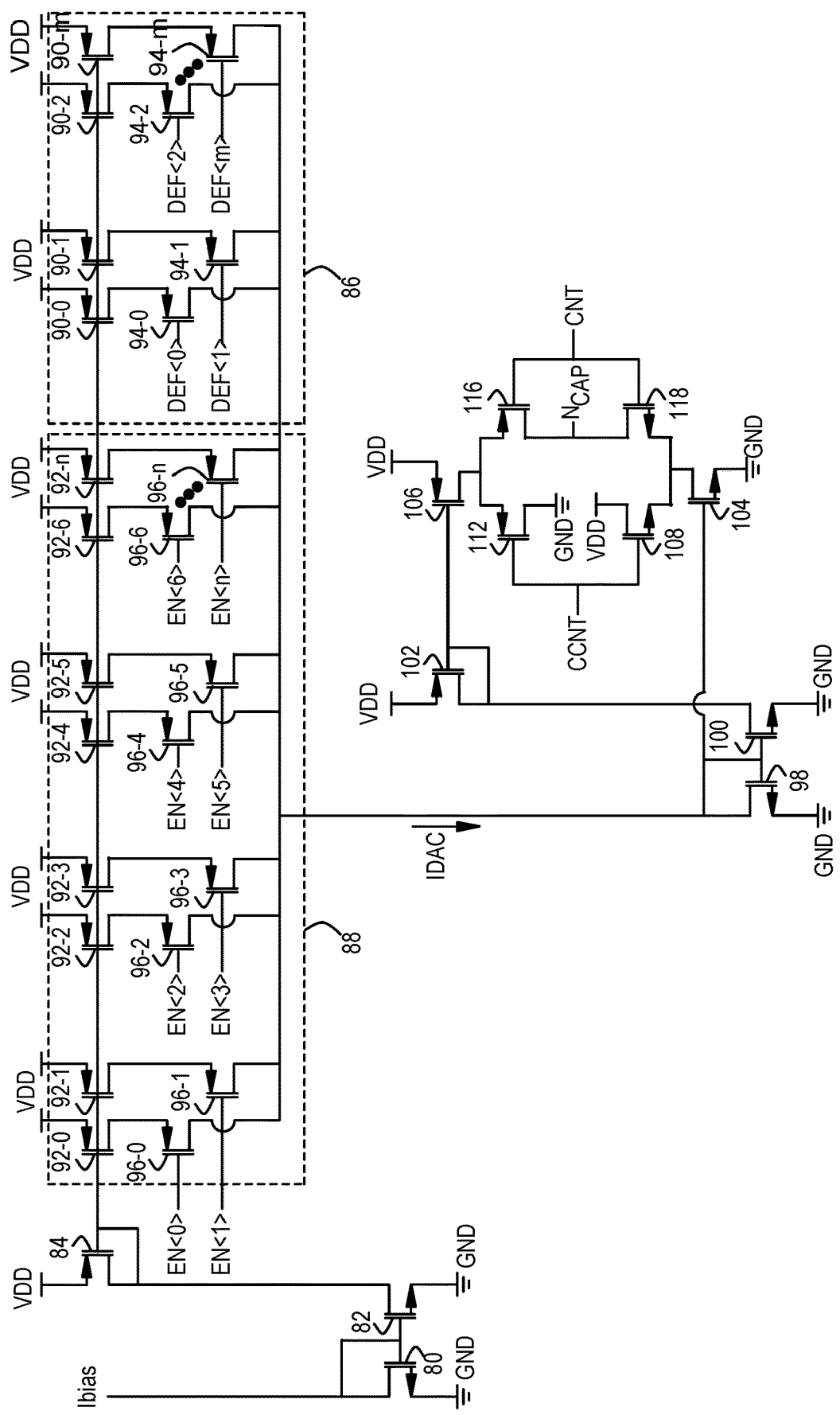
FIG. 5 illustrates a circuit diagram for a dynamically controllable current source according to some examples.

FIG. 5 illustrates a circuit diagram for a dynamically controllable current source according to some examples. The circuit diagram includes an n-type transistor (e.g., n-type metal-oxide-semiconductor (NMOS) transistor) current mirror that steers current through a digitally tunable p-type transistor (e.g., p-type MOS (PMOS)) current mirror.

In the n-type transistor current mirror, the drain of an n-type transistor 80 is electrically connected to a bias current node Ibias (where a bias current is provided), and the source of the n-type transistor 80 is electrically connected to the ground node GND. The drain of the n-type transistor 80 is further electrically connected to the gate of the n-type transistor 80 and the gate of another n-type transistor 82. The source of the n-type transistor 82 is electrically connected to the ground node GND.

The digitally tunable p-type transistor current mirror includes a p-type transistor 84, a default stage 86, and a dynamic stage 88. A source of the p-type transistor 84 is electrically connected to the power supply node VDD, and a drain of the p-type transistor 84 is electrically connected to a drain of the n-type transistor 82. The drain of the p-type transistor 84 is further electrically connected to respective gates of the p-type transistor 84, p-type transistors 90-0 through 90-m of the default stage 86, and p-type transistors 92-0 through 92-n of the dynamic stage 88. The respective sources of the p-type transistors 90-0 through 90-m and 92-0 through 92-n are electrically connected to the power supply node VDD. The drains of the p-type transistors 90-0 through 90-m are electrically connected to respective sources of p-type transistors 94-0 through 94-m of the default stage 86. The drains of the p-type transistors 92-0 through 92-n are electrically connected to respective sources of p-type transistors 96-0 through 96-n of the dynamic stage 88. The drains of the p-type transistors 94-0 through 94-m and 96-0 through 96-n are electrically connected together. The gates of the p-type transistors 94-0 through 94-m are electrically connected to respective default bit nodes DEF<m:0>. The gates of the p-type transistors 96-0 through 96-n are electrically connected to respective enable bit nodes EN<n:0>.

The p-type transistors 94-0 through 94-m and 96-0 through 96-n act as switches to electrically connect respective ones of the p-type transistors 90-0 through 90-m and 92-0 through 92-n as the current mirror. The p-type transistors 94-0 through 94-m can be selectively opened or closed based on the signals on the default bit nodes DEF<m:0>, and similarly, the p-type transistors 96-0 through 96-n can be selectively opened or closed based on the signals on the enable bit nodes EN<n:0>. The p-type transistors 90-0 through 90-m and 92-0 through 92-n, when electrically connected as part of the current mirror, can affect the gain realized by the p-type transistor current mirror. By electrically connecting various ones of the p-type transistors 90-0 through 90-m and 92-0 through 92-n as part of the current mirror, the effective width/length (W/L) ratio for the gain of the mirrored current through the p-type transistors 90-0 through 90-m and 92-0 through 92-n can be selectively controlled, which in turn controls the magnitude of current, collectively, through the p-type transistors 90-0 through 90-m and 92-0 through 92-n. The W/L ratio of the p-type transistors 90-0 through 90-m can be equal and/or different. For example, the W/L ratio can increase in a binary fashion, such as $(W/L)_0 * 2^i$ for each i from 0 to m for respective p-type transistors 90-0 through 90-m, where (W/L)o is some arbitrary W/L ratio. Similarly, the W/L ratio of the p-type transistors 92-0 through 92-n can be equal and/or different. For example, the W/L ratio can increase in a binary fashion, such as $(W/L)_0 * 2^i$ for each i from 0 to n for respective p-type transistors 92-0 through 92-n, where (W/L)o is some arbitrary W/L ratio. Any combination of equal or different W/L ratios may be implemented. The p-type transistors 92-0 through 92-n can enable fine granularity in the tuning of the dynamic stage 88, which can permit fine tuning of the current from the digitally tunable p-type transistor current mirror.

The signals asserted on the default bit nodes DEF<m:0> can be determined as a baseline for the relaxation oscillator 10. In some examples, once the signals that are to be asserted on the default bit nodes DEF<m:0> are determined, those signals are not changed. Hence, whichever ones of the p-type transistors 90-0 through 90-m are electrically connected as part of the current mirror remain electrically connected, while whichever ones of the p-type transistors 90-0 through 90-m are not electrically connected as part of the current mirror remain not electrically connected as part of the current mirror.

As described in detail below, the signals asserted on the enable bit nodes EN<n:0> are determined dynamically based on operation of the relaxation oscillator 10. For example, an operating supply voltage and/or operating temperature of the relaxation oscillator 10 can vary during operation, which can cause devices to operate differently. As an example, a change in operating temperature can alter a threshold voltage of transistors, which can in turn alter the operating speed of those transistors. Changing the operating speed of those transistors can affect a change in the latency of the component (e.g., a comparator, logic, or switch) of which those transistors form at least a part. Accordingly, the signals asserted on the enable bit nodes EN<n:0> are based on the PVT of the relaxation oscillator 10.

The drains of the p-type transistors 94-0 through 94-m and 96-0 through 96-n that are electrically connected together are further electrically connected to a drain and a gate of an n-type transistor 98, a gate of n-type transistor 100, and a gate of an n-type transistor 104. The respective sources of the n-type transistors 98 and 100 are electrically connected to the ground node GND. The drain of the n-type transistor 100 is electrically connected to a drain and a gate of a p-type transistor 102 and a gate of a p-type transistor 106. A source of the p-type transistor 102 is electrically connected to the power supply node VDD. Hence, in this configuration, the n-type transistors 98 and 104 form a current mirror steered by the current IDAC from the digitally tunable p-type transistor current mirror. Further, in this configuration, the n-type transistors 98 and 100 form a current mirror steered by the current IDAC from the digitally tunable p-type transistor current mirror, which further steers a current mirror formed by the p-type transistors 102 and 106.

A source of the p-type transistor 106 is electrically connected to the power supply node VDD, and a drain of the p-type transistor 106 is electrically connected to respective sources of p-type transistors 112 and 116. A drain of the p-type transistor 112 is electrically connected to the ground node GND. A drain of the p-type transistor 116 is electrically connected to a drain of an n-type transistor 118, which together form part of the capacitor node $N_{CAP}$ (e.g., as shown in FIG. 1).

A source of the n-type transistor 118 is electrically connected to a source of an n-type transistor 108 and a drain of the n-type transistor 104. A drain of the n-type transistor 108 is electrically connected to the power supply node VDD. A source of the n-type transistor 104 is electrically connected to the ground node GND.

The respective gates of the n-type transistor 118 and the p-type transistor 116 are electrically connected together and form at least part of a control node CNT. The respective gates of the n-type transistor 108 and the p-type transistor 112 are electrically connected together and form at least part of a complementary control node CCNT. The control node CNT and the complementary control node CCNT are electrically connected to respective output nodes of logic 26. Signals on the control node CNT and the complementary control node CCNT are generally complementary of each other. The p-type transistor 116 can generally correspond to the first switch 16 of FIG. 1, and the n-type transistor 118 can generally correspond to the second switch 18 of FIG. 1.

In operation in the dynamically controllable current source of FIG. 5, the collective current IDAC from the default stage 86 and dynamic stage 88 flows through the n-type transistor 98 by the series connection of the n-type transistor 98 with the default stage 86 and dynamic stage 88. The current IDAC through the n-type transistor 98 is mirrored (e.g., with or without any gain) through the n-type transistor 100, which current through the n-type transistor 100 further flows through the p-type transistor 102 by series connection. The current through the p-type transistor 102 is mirrored (e.g., with or without any gain) through the p-type transistor 106, which may be the first current source 12 of FIG. 1. Further, the current IDAC through the n-type transistor 98 is mirrored (e.g., with or without any gain) through the n-type transistor 104, which may be the second current source 14 of FIG. 1.

When the signal on the control node CNT is a low logic state (e.g., "0") and the signal on the complementary control node CCNT is a high logic state (e.g., "1"), the p-type transistor 116 and the n-type transistor 108 are conducting (e.g., in a closed state), and the n-type transistor 118 and the p-type transistor 112 are not conducting (e.g., in an open state). Hence, under such conditions, the current through the p-type transistor 106 flows from the power supply node VDD to the capacitor node $N_{CAP}$ through the p-type transistors 106 and 116. Further, current through the n-type transistor 104 flows from the power supply node VDD through the n-type transistors 108 and 104 to be drained to the ground node GND. Under these conditions, charge on the capacitor 20 electrically connected to the capacitor node $N_{CAP}$ is increased, and the voltage at the capacitor node $N_{CAP}$ is increased.

When the signal on the control node CNT is a high logic state (e.g., "1") and the signal on the complementary control node CCNT is a low logic state (e.g., "0"), the p-type transistor 116 and the n-type transistor 108 are not conducting (e.g., in an open state), and the n-type transistor 118 and the p-type transistor 112 are conducting (e.g., in a closed state). Hence, under such conditions, the current through the n-type transistor 104 is caused by voltage at the capacitor node $N_{CAP}$, which flows from the capacitor node $N_{CAP}$ through the n-type transistors 118 and 104 to the ground node GND. Further, current through the p-type transistor 106 is drained to the ground node GND through the p-type transistor 112. Under these conditions, charge on the capacitor 20 electrically connected to the capacitor node $N_{CAP}$ is decreased (e.g., discharged), and the voltage at the capacitor node $N_{CAP}$ is dissipated.

As can be seen from the configuration of the circuit in FIG. 5, controlling the current IDAC through the n-type transistor 98 using the default stage 86 and dynamic stage 88 can control the current through the capacitor 20 when charging and discharging. Hence, the frequency described in Equation (3) above can be controlled using the default stage 86 and dynamic stage 88.

Figure 6:
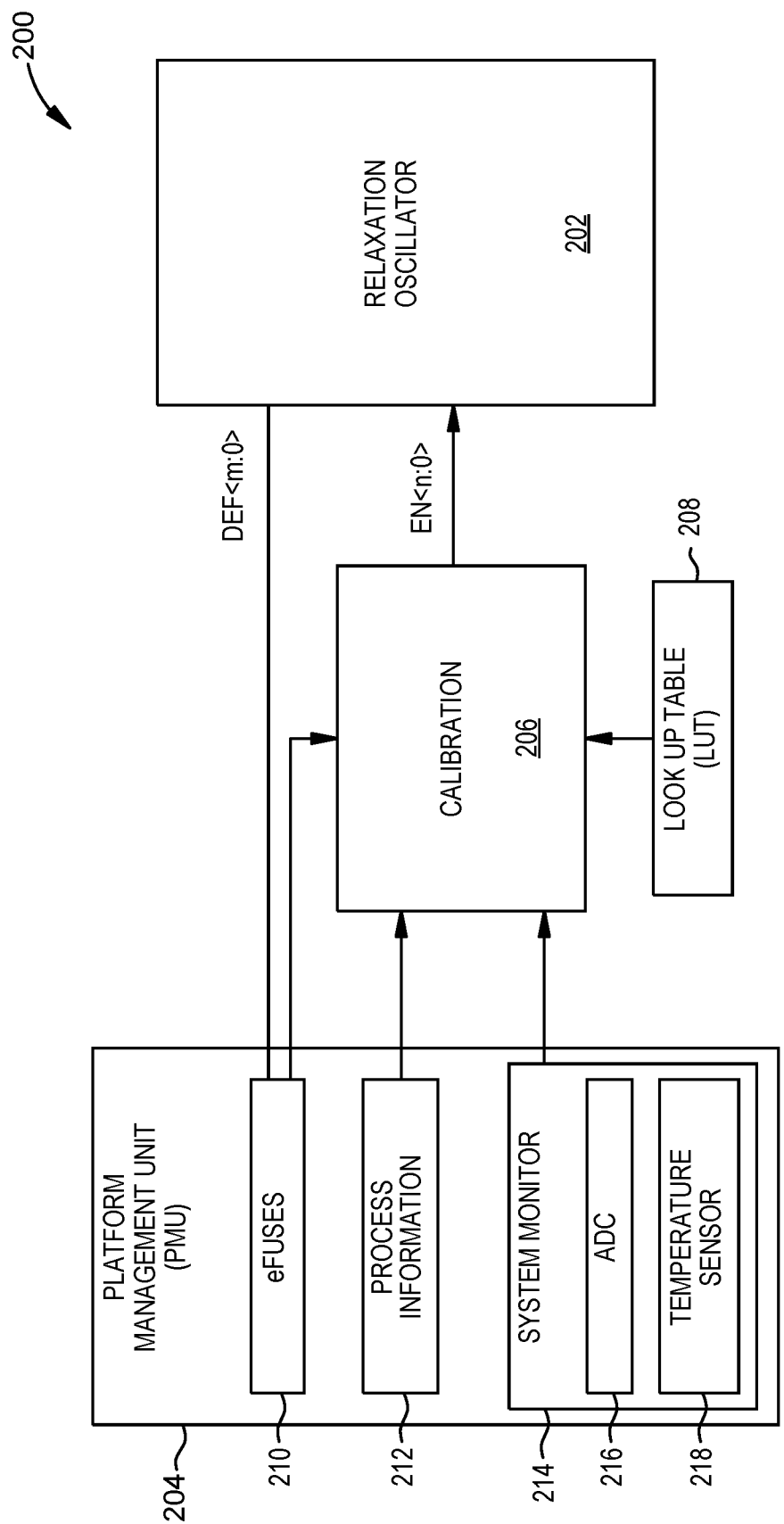
FIG. 6 illustrates an integrated circuit (IC) that includes a relaxation oscillator according to some examples.

FIG. 6 illustrates an integrated circuit (IC) 200 that includes a relaxation oscillator 202 according to some examples. In some examples, the IC 200 is implemented on a system-on-chip (SoC). The SoC can be an application specific IC (ASIC) in some examples. In some examples, the SoC can be a programmable device, such as a field programmable gate array (FPGA), which can include programmable logic.

The IC 200 includes the relaxation oscillator 202, a platform management unit (PMU) 204, calibration logic 206, and a Look Up Table (LUT) 208. The relaxation oscillator 202 includes the relaxation oscillator 10 of FIG. 1 with current sources 12 and 14 and switches 16 and 18 as illustrated in and described with respect to FIG. 5.

The PMU 204 includes one or more controllers and/or processors with memory or other storage medium. The PMU 204 can monitor and control various operations in the IC 200. The PMU 204 includes electrically programmable fuses (eFuses) 210, a process information block 212, and a system monitor 214.

The eFuses 210 are programmed to store bits for the default settings of the p-type transistors 90-0 through 90-$m$ of the default stage 86, which are output on the default bit nodes DEF<m:0> by the PMU 204. Hence, the eFuses 210 and PMU 204 are communicatively coupled to the relaxation oscillator 202 to output signals for the default settings to the default stage 86 of the relaxation oscillator 202. The default settings can be determined by wafer sort testing and subsequently programmed into the eFuses 210. The eFuses 210 are also programmed to store device data obtained by testing the IC 200. The device data includes or corresponds to, for example, a supply voltage and a temperature obtained during wafer sort testing. The temperature under which such testing is performed can be room temperature. The device data is provided to the calibration logic 206. Hence, the eFuses 210 and PMU 204 are communicatively coupled to the calibration logic 206 to provide the device data to the calibration logic 206.

The process information block 212 can include a controller and memory or other storage medium. The memory or other storage medium is programmed to store process information (e.g., MOS process information, such as typical, slow, and fast for each of n-type transistors and p-type transistors) relating to devices of the relaxation oscillator 202. This process information can indicate or correlate the behavior of devices in the relaxation oscillator 202 with various operating conditions, such as operating supply voltage and operating temperature. The process information is provided to the calibration logic 206. Hence, the process information block 212 and PMU 204 are communicatively coupled to the calibration logic 206 to provide the process information to the calibration logic 206.

The system monitor 214 can include a controller, memory (e.g., including registers), and various sensors. The system monitor 214 can be configured by writing to registers, and based on the configuration indicated by the registers, the system monitor 214 can monitor and control various conditions on the IC 200. As illustrated, the system monitor 214 includes an Analog-to-Digital Converter (ADC) 216 and a temperature sensor 218. The ADC 216 is configured to sense and measure the operating supply voltage of the IC 200, and the temperature sensor 218 is configured to sense and measure the operating temperature of the IC 200. The operating supply voltage and operating temperature are provided to the calibration logic 206. Hence, the system monitor 214 and PMU 204 are communicatively coupled to the calibration logic 206 to provide the operating supply voltage and operating temperature to the calibration logic 206.

The LUT 208 can be or include programmable logic, memory, or other storage medium. The LUT 208 is programmed to store various coefficients. In some examples, the data in the LUT 208 contains supply voltage coefficients as comparisons to the change in the operating supply voltage from the supply voltage during testing for each set of process information. In some examples, the data in the LUT 208 contains temperature coefficients as comparisons to the change in the operating temperature from the temperature during testing for each set of process information. Example coefficients are described in more detail below. The calibration logic 206 can retrieve coefficients from the LUT 208, and hence, the LUT 208 is communicatively coupled to the calibration logic 206.

The calibration logic 206 is operable to determine signals to be implemented on the enable bit nodes EN<n:0> based on the device data from the eFuses 210, the process information from the process information block 212, the operating supply voltage and operating temperature from the system monitor 214, and coefficients from the LUT 208. The data received from the eFuses 210, process information block 212, and system monitor 214 may be directly used in calculations described below and/or converted to another form that may be useful for calculations. The calibration logic 206 is configured to correlate the received information with operation of the relaxation oscillator 202 and determine the signals on the enable bit nodes EN<n:0> that can compensate the current through the capacitor 20 to offset variation in delay $t_d$ that results from changes in operating temperature and operating supply voltage.

In some examples, the calibration logic 206 may perform calculations using the received information to generate the signals to provide on the enable bit nodes EN<n:0>. Equation (4) below illustrates an example calculation that can be performed by the calibration logic 206 to determine the signals to provide on the enable bit nodes EN<n:0>:

$$EN\text{<}n\text{:}0\text{>}=(X(V_{SO}-V_{STEST})+Y(T_O-T_{TEST}))P_{MOS} \quad \text{Eq. (4)}$$

where $V_{SO}$ is or corresponds to the operating supply voltage from the system monitor 214, $V_{STEST}$ is or corresponds to the supply voltage obtained during testing and programmed in the eFuses 210, X is a supply voltage coefficient relating a difference between $V_{SO}$ and $V_{STEST}$ to operation of the relaxation oscillator 202, $T_O$ is or corresponds to the operating temperature from the system monitor 214, $T_{TEST}$ is or corresponds to the temperature obtained during testing and programmed in the eFuses 210, Y is a temperature coefficient relating a difference between $T_O$ and $T_{TEST}$ to operation of the relaxation oscillator 202, and $P_{MOS}$ is or corresponds to process information from the process information block 212 that further relates the voltage and temperature changes to operation of the relaxation oscillator 202. Any calculations and coefficients can be determined by testing the IC 200 (e.g., at wafer sort) and/or simulating operation of the IC 200 to determine effects of changes in voltage and temperature on the frequency of the signal output by the relaxation oscillator 202. A function can be modeled, like Equation (4) above, to permit the calibration logic 206 to determine the signals to be provided on the enable bit nodes EN<n:0> that offsets variations in the IC 200 due to changes in supply voltage and temperature.

Figure 7:
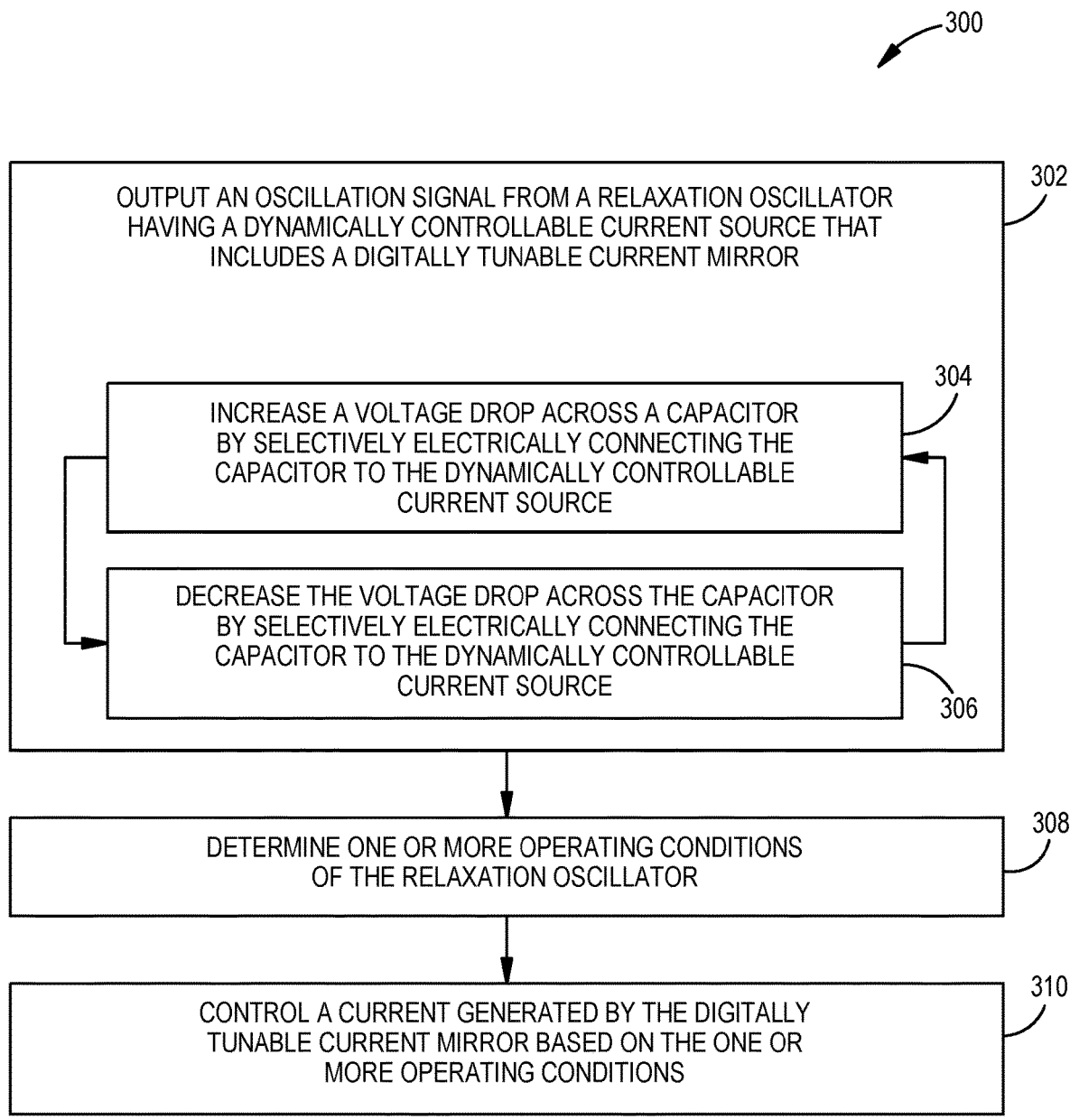
FIG. 7 is a flowchart of a method for operating an IC having a relaxation oscillator according to some examples.

FIG. 7 is a flowchart of a method 300 for operating an IC having a relaxation oscillator according to some examples. In operation 302, an oscillation signal is output from a relaxation oscillator. The relaxation oscillator includes a dynamically controllable current source comprising a digitally tunable current mirror configured to generate a current. The digitally tunable current mirror includes a dynamic stage (e.g., dynamic stage 88) that includes multiple transistors configured to be selectively electrically connected in parallel to alter a gain of the digitally tunable current mirror to control the current. The digitally tunable current mirror further comprises a default stage (e.g., default stage 86) that also includes multiple transistors configured to be selectively electrically connected in parallel based on static, default settings. At power up, the static, default settings connect appropriate ones of the multiple transistors of the default stage in parallel to begin generating a current of the dynamically controllable current source that is used in generating the oscillation signal. The static, default settings can be programmed into, e.g., the eFuses 210 as described above. The static, default settings can be determined at testing of the IC (e.g., wafer sort testing), and subsequently programmed into the eFuses 210.

Outputting the oscillation signal in operation 302 comprises alternatingly increasing, in operation 304, and decreasing, in operation 306, a voltage drop across a capacitor by selectively electrically connecting the capacitor to the dynamically controllable current source. As described previously, current flowing from the power supply node VDD to the capacitor can increase the voltage drop, and current can flow from the capacitor to the ground node GND to reduce the voltage drop.

In operation 308, one or more operating conditions of the relaxation oscillator are determined. As described previously, the conditions can be sensed or measured by the system monitor 214. Calibration logic 206 can use the conditions (e.g., operating supply voltage and operating temperature), along with testing supply voltage, testing temperature, and process information, to determine control signals for the dynamic stage of the dynamically controllable current source.

In operation 310, the current generated by the digitally tunable current mirror is controlled based on the one or more operating conditions. Controlling the current generated by the digitally tunable current mirror includes selectively connecting in parallel at least some of the multiple transistors of the dynamic stage. The control signals determined by the calibration logic 206 can be transmitted to the dynamic stage, which causes the various transistors to be connected in parallel.

Figure 8:
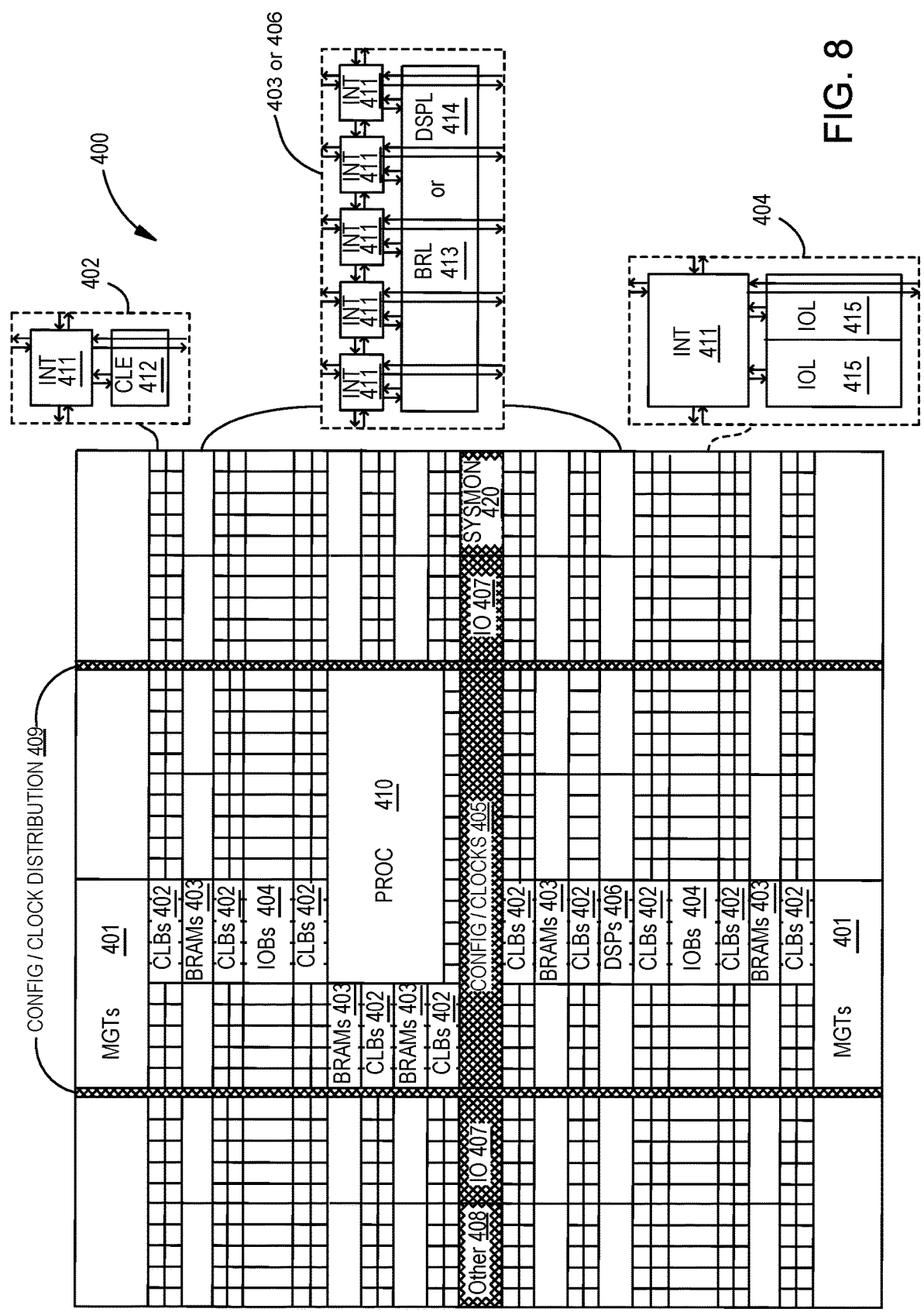
FIG. 8 illustrates an architecture of a field programmable gate array (FPGA) according to some examples.

FIG. 8 illustrates an FPGA architecture 400 of a programmable IC according to some examples. The programmable IC is an example SoC as stated above with respect to FIG. 6. The FPGA architecture 400 includes a large number of different programmable tiles including multi-gigabit transceivers (MGTs) 401, configurable logic blocks (CLBs) 402, random access memory blocks (BRAMs) 403, input/output blocks (IOBs) 404, configuration and clocking logic (CONFIG/CLOCKS) 405, digital signal processing blocks (DSPs) 406, specialized input/output blocks (IO) 407 (e.g., configuration ports and clock ports), and other programmable logic 408 (such as digital clock managers, analog-to-digital converters, system monitoring logic, and so forth). The FPGA architecture 400 also includes dedicated processor blocks (PROC) 410.

In some FPGAs, each programmable tile includes a programmable interconnect element (INT) 411 having standardized connections to and from a corresponding interconnect element in each adjacent tile. Therefore, the programmable interconnect elements taken together implement the programmable interconnect structure for the illustrated FPGA architecture 400. The programmable interconnect element 411 also includes the connections to and from the programmable logic element within the same tile, as shown by the examples included at the top of FIG. 8.

For example, a CLB 402 can include a configurable logic element (CLE) 412 that can be programmed to implement user logic plus a single programmable interconnect element (INT) 411. A BRAM 403 can include a BRAM logic element (BRL) 413 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 406 can include a DSP logic element (DSPL) 414 in addition to an appropriate number of programmable interconnect elements. An 10B 404 can include, for example, two instances of an input/output logic element (IOL) 415 in addition to one instance of the programmable interconnect element 411. As will be clear to those of skill in the art, the actual IO pads connected, for example, to the IO logic element 415 typically are not confined to the area of the input/output logic element 415. Calibration logic and a LUT can be implemented in CLBs 402 and/or BRAMs 403, for example.

In the pictured example, a horizontal area near the center of the die (shown in FIG. 8) is used for configuration, clock, and other control logic. Vertical columns 409 extending from this horizontal area or column are used to distribute the clocks and configuration signals across the breadth of the FPGA. The configuration and clocking logic 405 can include a relaxation oscillator.

The FPGA architecture 400 includes a PMU. For example, the PMU can be in the dedicated processor block 410 and/or distributed across various blocks throughout the horizontal area and/or vertical columns of the FPGA architecture 400. For example, the PMU includes a system monitor circuit (SYSMON) 420. The SYSMON 420 can include an Analog-to-Digital Converter (ADC) and a temperature sensor, among others. The ADC can be implemented to measure an operating supply voltage of the FPGA architecture 400. The temperature sensor can be implemented to measure an operating temperature of the FPGA architecture 400. In some examples, the SYSMON 420 can include other analog circuit(s) for performing analog signal processing. Similarly, the PMU can include a process information block and eFuses in the dedicated processor block 410 and/or distributed across various blocks.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 410 spans several columns of CLBs and BRAMs.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

In some examples, if the operating supply voltage increases, the logic delay $t_d$ will decrease. In order to compensate for this change, the current IDAC may be decreased. To do that, the process information is read from the process information block 212, and the supply voltage coefficient is selected from the prepopulated LUT 208. Based on the calculation of the calibration logic 206, some of the p-type transistors 96-0 through 96-$n$ are opened to reduce the current IDAC. This can result in an output current to the oscillator that is decreasing as the operating supply voltage increases, and hence, cancels the decrease of the delay $t_d$ so that the frequency can be maintained.

In another example, if the operating supply voltage increases (delay $t_d$ decreases) and the operating temperature also increases (delay $t_d$ increases), the calibration logic 206 can adjust the settings accordingly, and the signals on the enable bit nodes EN<n:0> may remain the same (e.g., if the two changes cancel each other) or may be changed.

Examples can provide digitally assisted analog performance improvement by knowing the process information, operating supply voltage, and operating temperature. In some examples, the parameters can be available as part of FPGA resources: Supply Voltage and On-Chip Temperature are provided by a System Monitor and MOS Process is provided by iXPCM IP (circuit which can also provide $I_{dsat}$ and $V_{tsat}$ measurements for MOS devices).

While the foregoing is directed to specific examples, other and further examples may be devised without departing from the basic scope thereof, and the scope thereof is determined by the claims that follow.

What is claimed is:

1. A circuit comprising:
   a dynamically controllable current source comprising a digitally tunable current mirror configured to generate a current, the digitally tunable current mirror including multiple transistors configured to be selectively electrically connected in parallel to alter a gain of the digitally tunable current mirror to control the current;
   a capacitor selectively electrically connected to the dynamically controllable current source;
   an oscillator generation circuit electrically connected to the capacitor, the oscillator generation circuit being configured to generate an oscillation signal in response to a voltage of the capacitor; and
   calibration logic configured to control the current of the digitally tunable current mirror based on a sensed temperature and a sensed operating supply voltage.

2. The circuit of claim 1 further comprising a system monitor comprising a temperature sensor and an Analog-to-Digital Converter (ADC), the temperature sensor sensing the sensed temperature, the ADC sensing the sensed operating supply voltage.

3. The circuit of claim 1, wherein the calibration logic is further configured to control the current of the digitally tunable current mirror based on process information of the oscillator generation circuit.

4. The circuit of claim 1, wherein the multiple transistors are selectively electrically connected in parallel via selector transistors, each of the multiple transistors being connected in series by a respective one of the selector transistors.

5. The circuit of claim 4 further comprising calibration logic electrically connected to respective gates of the selector transistors, the calibration logic being configured to assert respective signals on the gates of the selector transistors to selectively electrically connect the multiple transistors in parallel.

6. The circuit of claim 1, wherein the oscillator generation circuit includes:
   a first comparator configured to compare the voltage of the capacitor to a high reference voltage;
   a second comparator configured to compare the voltage of the capacitor to a low reference voltage; and
   comparison logic electrically connected to the first comparator and the second comparator, the comparison logic configured to generate the oscillation signal based on comparisons of the voltage of the capacitor to the high reference voltage and to the low reference voltage.

7. The circuit of claim 1, wherein the dynamically controllable current source includes:
   a first p-type transistor configured in a first current mirror, a current through the first p-type transistor being steered by the current of the digitally tunable current mirror;
   a second p-type transistor, a drain of the first p-type transistor being electrically connected to a source of the second p-type transistor;
   a first n-type transistor configured in a second current mirror, a current through the first n-type transistor being steered by the current of the digitally tunable current mirror; and
   a second n-type transistor, a drain of the first n-type transistor being electrically connected to a source of the second n-type transistor, a drain of the second p-type transistor being electrically connected to a drain of the second n-type transistor as a capacitor node, the capacitor being electrically connected to the capacitor node, respective gates of the second p-type transistor and the second n-type transistor being electrically connected together.

8. A method for operating an integrated circuit, the method comprising:
   outputting an oscillation signal from a relaxation oscillator comprising alternatingly increasing and decreasing a voltage drop across a capacitor by selectively electrically connecting the capacitor to a dynamically controllable current source, the dynamically controllable current source comprising a digitally tunable current mirror configured to generate a current, the digitally tunable current mirror including multiple transistors configured to be selectively electrically connected in parallel to alter a gain of the digitally tunable current mirror to control the current;
   determining, by a system monitor, operating conditions of the relaxation oscillator, the operating conditions including an operating temperature of the relaxation oscillator and an operating supply voltage of the relaxation oscillator; and
   controlling, by calibration logic, the current generated by the digitally tunable current mirror based on the operating conditions received from the system monitor, controlling the current generated by the digitally tunable current mirror comprising selectively connecting in parallel at least some of the multiple transistors.

9. The method of claim 8, wherein controlling the current generated by the digitally tunable current mirror is further based on process information of the relaxation oscillator.

10. The method of claim 8, wherein controlling the current generated by the digitally tunable current mirror is further based on a model of a change of frequency of the oscillation signal based on a change of one or more of the operating conditions.

11. The method of claim 8, wherein controlling the current generated by the digitally tunable current mirror includes maintaining a frequency of the oscillation signal when one or more of the operating conditions change.

12. The method of claim 8, wherein alternatingly increasing and decreasing the voltage drop across the capacitor by selectively electrically connecting the capacitor to the dynamically controllable current source includes:
   electrically closing a first switch to direct a first current generated by the dynamically controllable current source flowing from a supply voltage node to the capacitor to increase the voltage drop across the capacitor, the first current flowing through the first switch when the first switch is electrically closed; and
   electrically closing a second switch to direct a second current generated by the dynamically controllable current source flowing from the capacitor to a ground node to decrease the voltage drop across the capacitor, the second current flowing through the second switch when the second switch is electrically closed, the first switch is electrically opened when the second switch is electrically closed, and the second switch is electrically opened when the first switch is electrically closed.

13. A circuit comprising:
   a relaxation oscillator comprising:
      a dynamically controllable current source;
      a capacitor connected to the dynamically controllable current source via one or more switches; and
      an oscillator generation circuit electrically connected to the capacitor, the oscillator generation circuit being configured to generate an oscillation signal in response to a voltage across the capacitor and to generate a signal to control the one or more switches;
   a system monitor configured to sense operating conditions of the relaxation oscillator, the operating conditions including a temperature of the relaxation oscillator and an operating supply voltage of the relaxation oscillator; and
   calibration logic configured to control a current of the dynamically controllable current source based on the operating conditions.

14. The circuit of claim 13, wherein the system monitor comprises an Analog-to-Digital Converter (ADC) configured to sense the operating supply voltage of the relaxation oscillator, and comprises a temperature sensor configured to sense the temperature of the relaxation oscillator.

15. The circuit of claim 13, wherein the calibration logic is configured to generate one or more signals to control the current of the dynamically controllable current source based on a model of a change of frequency of the oscillation signal based on a change of one or more of the operating conditions.

16. The circuit of claim 13, wherein the dynamically controllable current source includes a first current mirror having a dynamic stage, the dynamic stage comprising multiple transistors configured to be selectively electrically connected in parallel in the first current mirror, the calibration logic being configured to generate signals that respectively cause the multiple transistors to be selectively electrically connected in parallel.

17. The circuit of claim 16, wherein the dynamically controllable current source further includes:
a second current mirror configured to be steered by a first current generated by the first current mirror,
a first switch, the second current mirror being connected between a supply voltage node and the capacitor via the first switch;
a third current mirror configured to be steered by the first current generated by the first current mirror; and
a second switch, the third current mirror being connected between the capacitor and a ground node via the second switch.

* * * * *